US011143553B2

United States Patent
Williams, III et al.

(10) Patent No.: US 11,143,553 B2
(45) Date of Patent: Oct. 12, 2021

(54) METHOD TO OPERATE AN OPTICAL SENSOR ARRANGEMENT WITH IMPROVED OFFSET CORRECTION AND OPTICAL SENSOR ARRANGEMENT

(71) Applicant: ams International AG, Rapperswil (CH)

(72) Inventors: Louis Albert Williams, III, Rapperswil (CH); Gonggui Xu, Rapperswil (CH)

(73) Assignee: AMS INTERNATIONAL AG, Rapperswil (CH)

( * ) Notice: Subject to any disclaimer, the term of this patent is extended or adjusted under 35 U.S.C. 154(b) by 5 days.

(21) Appl. No.: 16/955,658

(22) PCT Filed: Dec. 28, 2018

(86) PCT No.: PCT/EP2018/085535
§ 371 (c)(1),
(2) Date: Jun. 18, 2020

(87) PCT Pub. No.: WO2019/121709
PCT Pub. Date: Jun. 27, 2019

(65) Prior Publication Data
US 2020/0386617 A1 Dec. 10, 2020

Related U.S. Application Data

(60) Provisional application No. 62/609,221, filed on Dec. 21, 2017.

(51) Int. Cl.
*G01J 1/46* (2006.01)
*H03F 3/08* (2006.01)
(Continued)

(52) U.S. Cl.
CPC .............. *G01J 1/46* (2013.01); *H03F 3/08* (2013.01); *H03F 3/45968* (2013.01);
(Continued)

(58) Field of Classification Search
CPC .. G01J 1/46; G01J 2001/444; G01J 2001/446; H03F 3/08; H03F 3/45968; H03M 1/46
See application file for complete search history.

(56) References Cited

U.S. PATENT DOCUMENTS

| 7,620,291 | B1 | 11/2009 | Aswell |
| 2015/0326805 | A1* | 11/2015 | Scott ..................... H04N 5/378 348/243 |

(Continued)

OTHER PUBLICATIONS

European Patent Office, International Search Report for PCT/EP2018/085535 dated Apr. 12, 2019.
(Continued)

*Primary Examiner* — Thanh Luu
*Assistant Examiner* — Monica T Taba
(74) *Attorney, Agent, or Firm* — MH2 Technology Law Group LLP

(57) ABSTRACT

An optical sensor arrangement comprises a photodiode and a converter arrangement including an integration amplifier, a comparator amplifier, an integration capacitor and a comparator capacitor. An offset of the integration amplifier is corrected in that the integrator output signal is compared with a high and a low comparison voltage to repetitively adjust an offset trim value. The use of two comparison thresholds creates noise immunity.

18 Claims, 10 Drawing Sheets

(51) Int. Cl.
    *H03F 3/45*     (2006.01)
    *H03M 1/46*     (2006.01)
    *G01J 1/44*     (2006.01)
(52) U.S. Cl.
    CPC ......... *H03M 1/46* (2013.01); *G01J 2001/444* (2013.01); *G01J 2001/446* (2013.01)

(56) References Cited

U.S. PATENT DOCUMENTS

2016/0308550 A1   10/2016   Tang
2017/0194917 A1   7/2017    Tanabe

OTHER PUBLICATIONS

European Examination Report in corresponding EP Application No. 18833854.5 dated Aug. 11, 2021, 6 pages.

* cited by examiner

METHOD TO OPERATE AN OPTICAL SENSOR ARRANGEMENT WITH IMPROVED OFFSET CORRECTION AND OPTICAL SENSOR ARRANGEMENT

CROSS-REFERENCE TO RELATED APPLICATIONS

The present application is the national stage entry of International Patent Application No. PCT/EP2018/085535, filed on Dec. 18, 2018, which claims benefit of priority of U.S. Patent Application No. 62/609,221 filed on Dec. 21, 2017, all of which are hereby incorporated by reference in their entirety for all purposes.

TECHNICAL FIELD

This disclosure relates to offset reduction in photodiode-based light sensor amplifiers. Specifically, this disclosure relates to an optical sensor arrangement that includes a photodiode, a converter arrangement comprising an integration amplifier, a comparator amplifier and integration and comparator capacitors. A controller operates the converter arrangement to perform offset reduction loops. This disclosure concerns a method to operate such a sensor arrangement and the sensor arrangement to be used in the method.

BACKGROUND

Light-to-digital (LDC) converters are widely used in electronic devices such as smartphones or computer displays to control their operation dependent on the ambient light conditions. The LDC converter may include a converter arrangement that measures the current through a photodiode to generate a value that is indicative of the amount of ambient light impinging on the photodiode. The integration amplifier within the LDC converter inherently exhibits an offset that must be corrected to achieve as accurate of a result as possible for of the light-to-digital conversion. As the offset may be small or becomes small during a repetitive reduction process, the correction process may be impacted by noise.

Existing solutions for offset correction have been slow and have required averaging steps to overcome noise in the offset sensing circuits. For example, a previous solution has used a single comparison threshold $V_{NOM}$, $V_{COMP}$, as illustrated in FIG. 1. When the offset correction is close to the correct value, the input to the comparator noise causes the algorithm to not be able to distinguish between a slightly high value and a slightly low value, so that the algorithm tended to chatter between the two.

SUMMARY

According to an embodiment, a method to operate an optical sensor arrangement, wherein the optical sensor arrangement comprises: a photodiode; a converter arrangement, that comprises: an integration amplifier and a comparator amplifier, the integration amplifier having an offset; an integration capacitor coupled to an input of the integration amplifier; a comparator capacitor coupled to an input of the comparator amplifier;

an offset register to control the offset of the integration amplifier in response to an offset trim value stored in the offset register; the photodiode decoupled from the input side of the first amplifier; a controller to operate the converter arrangement; the method performs a multitude of offset reduction loops, each loop comprising the steps of: setting an input of the comparator amplifier to one of a high and a low comparison voltage; comparing the integrator output signal with the one of the comparison voltages at the comparator amplifier; setting the input of the comparator amplifier to another one of the high and the low comparison voltage; comparing the integrator output signal with the other one of the comparison voltages at the comparator amplifier; and adjusting the offset trim value in response to one of the steps of comparing. This process enables a two comparison threshold procedure to improve noise immunity of the offset reduction procedure.

According to an embodiment, a reference voltage is applied to an output of the integration amplifier after the step of comparing the integrator output signal with the other one of the comparison voltages at the comparator amplifier in each one of the multitude of offset reduction loops to perform a reset of the integration amplifier. Accordingly, a reset procedure is performed at each decision step or loop which improves and accelerates the recovery time between steps.

The comparator amplifier may be set to sample the reference voltage so that the output of the comparator amplifier drives the output of the integrator amplifier at the end of an offset reduction loop to perform the reset of the integration amplifier. The comparator amplifier may drive the output of the integrator amplifier after a step of adjusting the offset trim value.

According to an embodiment, a counter may count the time within which the offset reduction loop is performed. The time counting may be increased in a subsequent offset reduction loop. Accordingly, the loop time is short in the beginning and is gradually longer at the end of the offset reduction process so that the total time for the offset reduction process is shortened. This does not decrease the accuracy because it is assumed that a large deviation at the beginning needs only little time to settle, whereas a smaller deviation at the end requires more time.

According to an embodiment, the offset trim value may be adjusted by a change value that is decreased in a subsequent offset reduction loop. Accordingly, a smaller change value is associated with a longer loop time value. In subsequent ones of the multitude of offset reduction loops, the change value may be gradually decreased to update the offset trim value. Concurrently, an adaptive count is performed to give longer time for the performance of a loop as the offset is corrected closer to zero.

According to an embodiment, at least two offset reduction loops may be performed consecutively while the change value to update the offset trim value is maintained. The change value is the same during the performance of the at least two loops. This allows two loops per offset trim value update so that an error in case of a wrong decision, e.g. due to noise, can be recovered. This allows a two-step per bit algorithm to provide error recovery.

According to an embodiment, an optical sensor arrangement to be used in the above-mentioned method comprises: a photodiode; a converter arrangement, that comprises: an integration amplifier and a comparator amplifier, the integration amplifier having an offset; an integration capacitor coupled to an input of the integration amplifier; a comparator capacitor coupled to an input of the comparator amplifier; an offset register to control the offset of the integration amplifier in response to an offset trim value stored in the offset register; the photodiode to be coupled to the input side of the first amplifier;

a controller to generate control signals operate the converter arrangement through a multitude of offset correction loops, wherein the converter arrangement is configured to adopt a configuration in response to the control signals generated by the controller, the configuration selected from the group comprising a high gain initialization configuration, a high gain idle configuration, an open loop measure configuration, an open loop amplify configuration and an open loop compare configuration. The converter arrangement is configured to perform a consecutive sequence of two or more of said configurations to achieve an offset reduction of the integration amplifier.

According to an embodiment, in the high gain initialization configuration, the integration amplifier is configured in a no-feedback state, an output of the integration amplifier is disconnected from the comparator capacitor, inputs of the integration amplifier are shorted through a switch and the integration capacitor is connected to the output of the comparator amplifier to sample a reference voltage on the integration capacitor.

According to an embodiment, in the high gain idle configuration, the integration amplifier is configured in a feedback state, the output of the integration amplifier is disconnected from the output of the comparator amplifier and the switch across the inputs of the integration capacitor is opened.

According to an embodiment, in the open loop measure configuration, the feedback around the integration amplifier is removed, the inputs of the integration amplifier are shorted to ground potential and one of a high and a low comparison voltage is applied to the comparator capacitor.

According to an embodiment, in the open loop amplify configuration, the feedback around the integration amplifier is open, the inputs of the integration amplifier are shorted to ground potential and the output of the integration amplifier is connected to the comparator capacitor.

According to an embodiment, in the open loop compare configuration, the feedback around the integration amplifier is open, the inputs of the integration amplifier are shorted to ground potential and the output of the integration amplifier is connected to the comparator capacitor, wherein the comparator amplifier or a comparator device that is connected to the output of the comparator amplifier are configured to make a decision.

An application of the optical sensor arrangement is given with a mobile communication device. The optical sensor arrangement supplies a signal indicative of ambient light to control the brightness of a display screen of the mobile communication device.

According to the method and circuit disclosed, a two-threshold comparator system is used to provide a noise immunity guard band. A reset procedure is used at each step to speed up the recovery time between steps. The time at each algorithm steps is kept short in the early stages and gradually lengthened at later steps to reduce the total time. A redundant two-step per bit algorithm is used that provides further noise immunity.

The present light sensor provides a faster convergence to the optimal offset correction value and is less sensitive to circuit noise.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
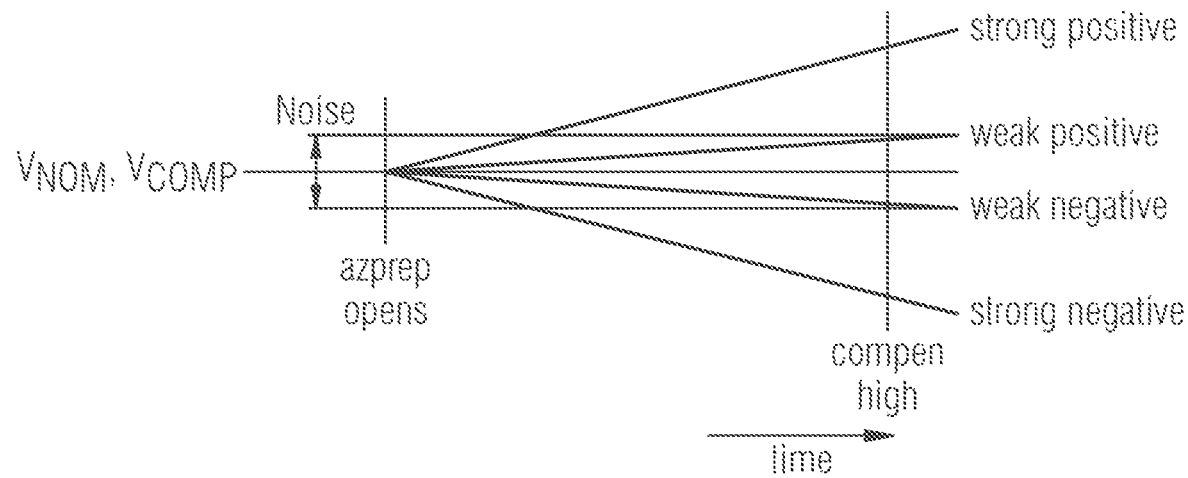
FIG. 1 shows signals relative to a single comparison threshold.
Figure 2:
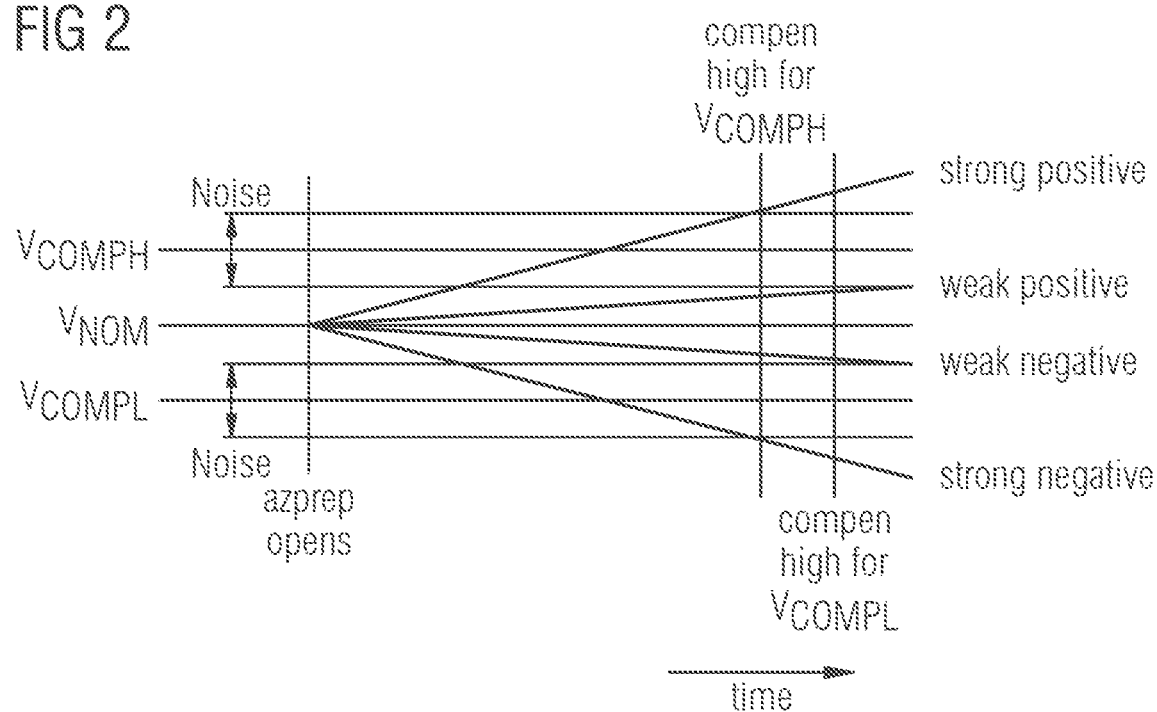
FIG. 2 shows signals relative to two comparison thresholds.

To illustrate the two-threshold structure, FIG. 2 shows how the two thresholds $V_{COMPH}$, $V_{COMPL}$ create a band that separates the comparator noise from the comparison result. This solution improves the offset computation time considerably, e.g., by a factor of five and improves immunity to noise in the amplifier input.

The following embodiment description first gives an overview of the light-to-digital converter architecture, then gives an overview of the analog circuitry, and finally describes the digital control for the offset correction algorithm and how it controls the analog circuitry. In this embodiment, offset correction is called "auto-zero" because it is zeroing out the amplifier offset.

Figure 3:
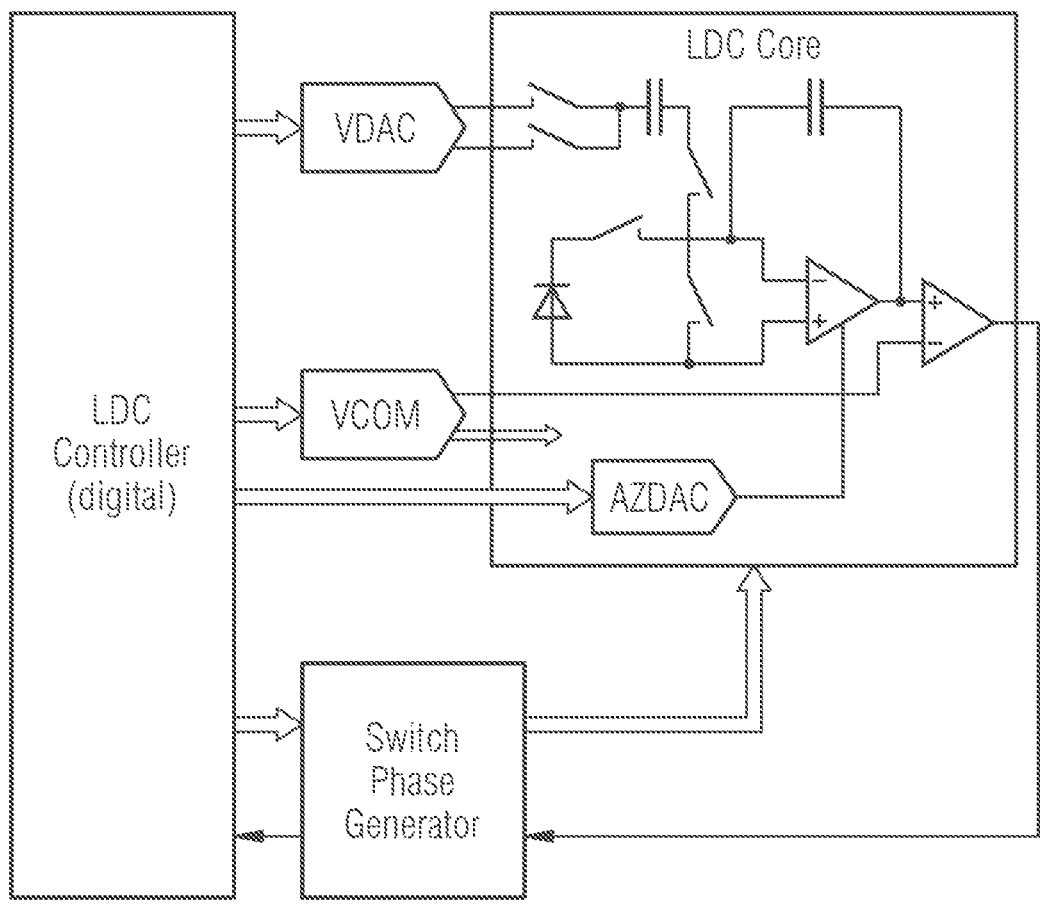
FIG. 3 shows a principle top level block diagram of a light-to-digital (LDC) converter.

The light-to-digital converter (LDC) architecture is shown in FIG. 3. It comprises the following elements. A digital LDC controller manages the switch timing, DAC settings, and result computation. A VCOM digital-to-analog converter (DAC) generates the voltages vcomp and vmid described below. A VDAC digital-to-analog converter generates voltages used in part of the conversion algorithm that are not part of the offset correction algorithm. A switch phase generator takes the single phase control from the digital controller and generates non-overlapping and delayed clock phases for the switched-capacitor circuits in the LDC core. In the LDC core, the light measurement takes place and the offset cancellation is implemented. As part of that core, there is an "auto-zero" DAC, AZDAC, that is controlled by the digital LDC controller and whose output is summed with the main amplifier input. The purpose of the offset cancellation algorithm is to adjust this AZDAC until the net DC offset of the main amplifier is near zero.

The VCOM output vmid is a fixed value near the mid-range of the voltage swing of the analog circuits, shown as $V_{NOM}$ in FIG. 2. The VCOM output vcomp is controlled by the parameter LdcCompThresh. LdcCompThresh has three possible values (2'b11, 2'b10, and 2'b00; binary values 11, 10, and 00) which are converted into three vcomp values shown in FIG. 2: $V_{COMPH}$, $V_{COMPL}$, and $V_{NOM}$.

The AZDAC is controlled by the parameter LdcNOffsetTrim. In this embodiment, AZDAC is 12-bit DAC with an offset resolution of 1 µV and a range of +/−2.047 mV. If LdcNOffsetTrim is a signed integer between −2047 and +2047, the net offset of the main amplifier is Voffset+(LdcNOffsetTrim*(1 µV/2047)) where Voffset is the default offset of the amplifier due to device mismatch.

Core Analog Circuit

Figure 4:
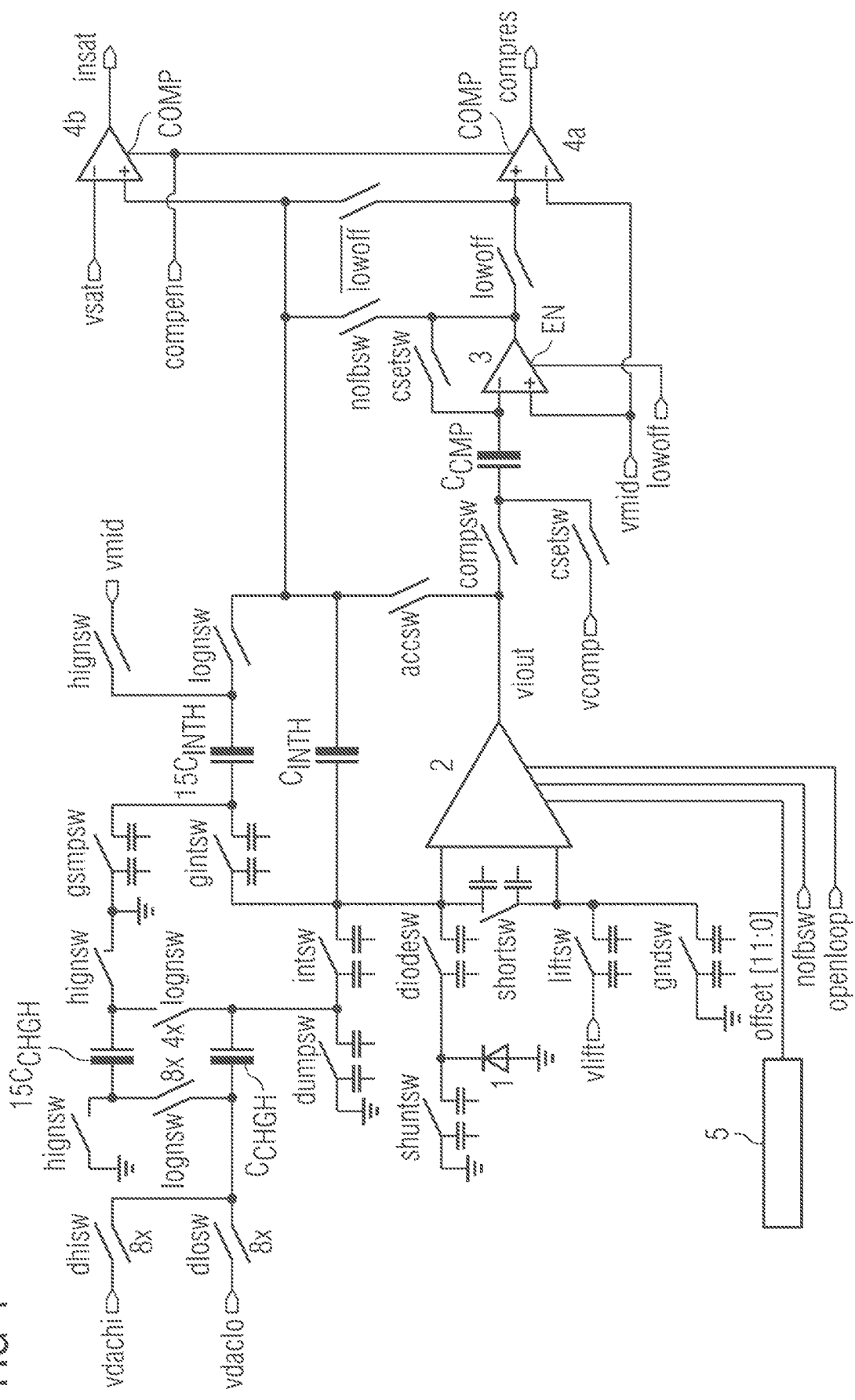
FIG. 4 shows a detailed block diagram of the core analog circuit of FIG. 3.

The core analog circuit comprises an integrator, a comparator amplifier, and a latched comparator. A variety of switches configure the operation of the circuits. An overview of the core analog circuit is shown in FIG. 4.

The core analog circuit comprises a photodiode 1 that may be subjected to ambient light to be measured. The photodiode 1 is coupled through a switch to the input of an integration amplifier 2. For the herein described offset correction process, the photodiode 1 is disconnected from the circuit. An integration capacitor $C_{INTH}$ is connected at least to the input side of the integration amplifier 2. The integration capacitor $C_{INTH}$ may be connected to form a feedback loop to the integration amplifier 2 to form an integrator or may be connected to the output of a comparator amplifier 3 connected downstream the integration amplifier 2 or may be open ended as described herein below. The integration amplifier 2 exhibits an offset that is to be corrected by an offset correction signal offset[11:0] stored in a register 5. The process to generate the signal offset[11:0] to make the resulting, corrected offset of the integration amplifier 2 as small as possible and substantially to zero is described herein below.

The input side of the comparator amplifier 3 is connected to a comparator capacitor $C_{CMP}$ to which a threshold voltage $V_{COMPH}$, $V_{COMPL}$ can be applied. Another input of the comparator amplifier may be supplied with a reference voltage Vmid.

Two latching comparators 4a, 4b are connected downstream the comparator amplifier 3 to perform a latching of the comparator amplifier output signal. The latching is performed in response to a control signal compen. The latching comparators may be two differentially operated comparators as shown in FIG. 4 or may be realized as one comparator. The function of the latching comparator may be also included in the comparator amplifier 3.

The different switch shapes indicate if the switch is a simple NMOS switch, a CMOS switch, or an NMOS switch with dummy switches for charge balancing. The signal offset[11:0] controls the AZDAC, and is connected outside this diagram to the parameter LdcNOffsetTrim. The offset [11:0] signal is stored in register 5 that is updated repetitively through a multitude of operation loops. The offset[11:0] signal is controlled by the parameter LdcNOffsetTrim generated according to the below described process.

The combinations of switch phases that are used during the autozero algorithm are described below.

High Gain Initialization Configuration

In the high gain initialization, the following switches are closed: hignsw, gsmpsw, shuntsw, nofbsw, csetsw, lowoff, dlosw, dumpsw, shortsw, gndsw, and en. All other switches are open. This configuration disconnects the low gain capacitors and puts the main amplifier in its no-feedback state. The comparator amplifier is set to sample the comparator voltage and simultaneously drive vmid at its output. This vmid output is used to sample vmid onto the integrating capacitor.

This configuration is also used at the end of an auto-zero step to prepare for the next step. Here, the proper voltage level on the integrating capacitor should have been held from the beginning of the previous step, and only the charge that leaked away during the auto-zero step needs to be restored. The new compare value is also sampled on to the comparator capacitor $C_{CMP}$, but there are at least five clock periods (6.8 µs) before that voltage needs to settle.

Figure 5A:
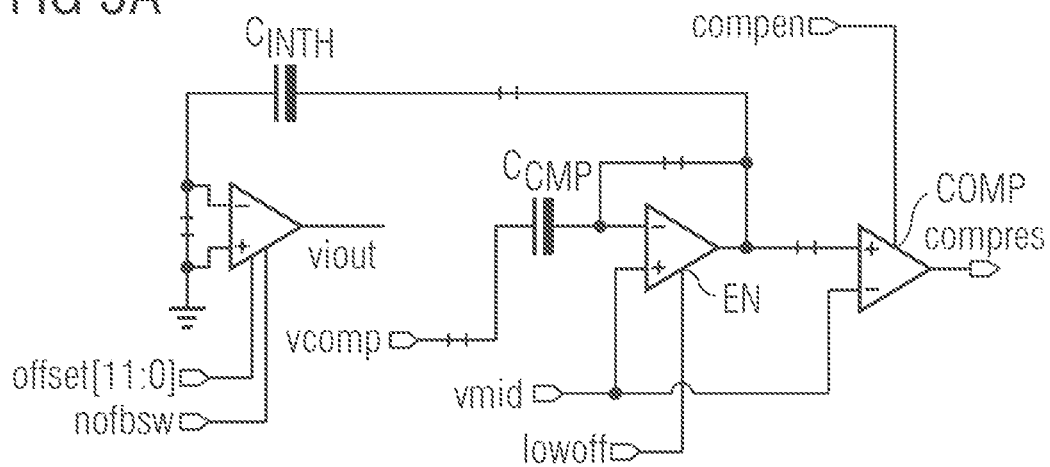
FIGS. 5A through 5E show configurations of the core analog circuit of FIG. 4 used during the auto-zero algorithm.

An overview of the high gain initialization configuration is shown in FIG. 5A.

It is to be noted that the charge redistribution capacitors, Cchgh and 15Cchgh, remain idle and tied to ground for the entire auto-zero algorithm, so they are not shown.

High Gain Idle Configuration

In the high gain idle configuration, the following switches are closed: hignsw, gsmpsw, shuntsw, accsw, csetsw, lowoff, dlosw, dumpsw, gndsw, and en. All other switches are open.

This configuration always follows the high gain initialization configuration. The feedback loop of the integrator is closed around the voltage that was sampled on the integration capacitance, and the amplifier is placed in its normal gain mode (nofbsw is low). The shortsw that was closed in the high gain initialization is opened in order to hold the voltage across the integration capacitor. Two clock periods are allowed for the voltage levels to settle (2.71 µs).

Figure 5B:
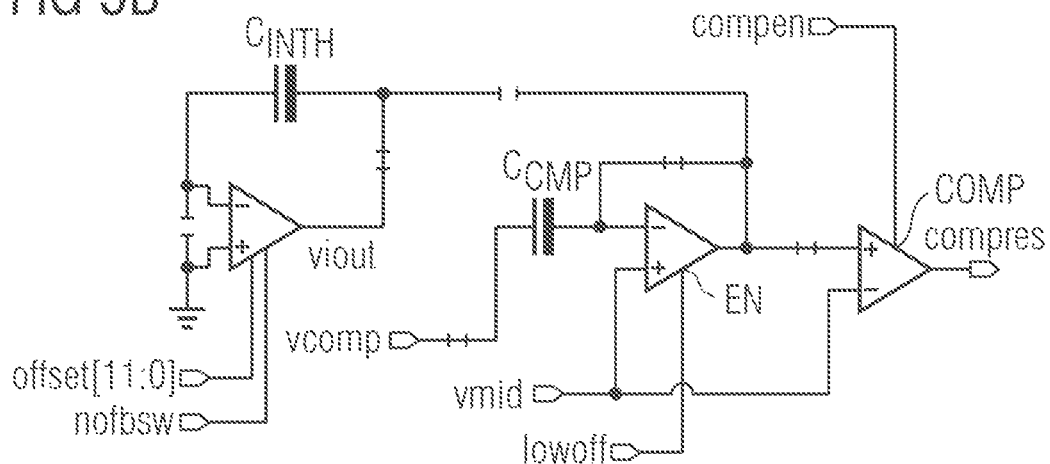

An overview of the high gain idle configuration is shown in FIG. 5B.

It is to be noted that the charge redistribution capacitors remain idle and tied to ground for the entire auto-zero algorithm, so they are not shown.

Open Loop Measure Configuration

The open loop measure configuration is used in the auto-zero algorithm to determine whether the offset[11:0] setting is too high or too low. The feedback around the main amplifier is removed and the amplifier input is shorted to ground. Any uncompensated amplifier offset is amplified by the open loop gain of the main amplifier. In this configuration, the following switches are closed: hignsw, gsmpsw, shuntsw, csetsw, lowoff, dlosw, dumpsw, shortsw, gndsw, openloop, and en. All other switches are open.

This configuration initially follows the high gain idle configuration, so the integrator output is precharged to approximately vmid. Ideally, the main amplifier output, viout, will swing either to vdd or ground depending on whether the offset setting is too low or too high. However, the time constant of this response is quite long if the offset is close to the desired value. If the amplifier is approximated as a single-pole response, the amplifier output as a function of time during the open loop measure configuration will be Viout(t)=vmid+(Voffset+(LdcNOffsetTrim*(1 µV/2047)))*(t/Tu) where Tu is the open-loop settling time constant. The auto-zero algorithm makes use of the fact that different offset errors will have different response times. Table 1 below lists the minimum resolution times ($T_{AZRMX}$) for various values of vdiff for this embodiment, where vdiff is the net offset (Voffset+(LdcNOffsetTrim*(1 µV/2047)).

TABLE 1

| vdiff | $T_{AZRMX}/T_{MCLK}$ | $T_{AZRMX}$ (µS) |
|---|---|---|
| \|vdiff\| ≥ 1 µV | 64 | 86.8 |
| \|vdiff\| ≥ 2 µV | 32 | 43.4 |
| \|vdiff\| ≥ 4 µV | 16 | 21.7 |
| \|vdiff\| ≥ 6 µV | 4 | 5.4 |
| \|vdiff\| ≥ 8 µV | 8 | 10.9 |
| \|vdiff\| ≥ 16 µV | 4 | 5.4 |
| \|vdiff\| ≥ 32 µV | 2 | 2.7 |
| \|vdiff\| ≥ 64 µV | 1 | 1.3 |

Figure 5C:
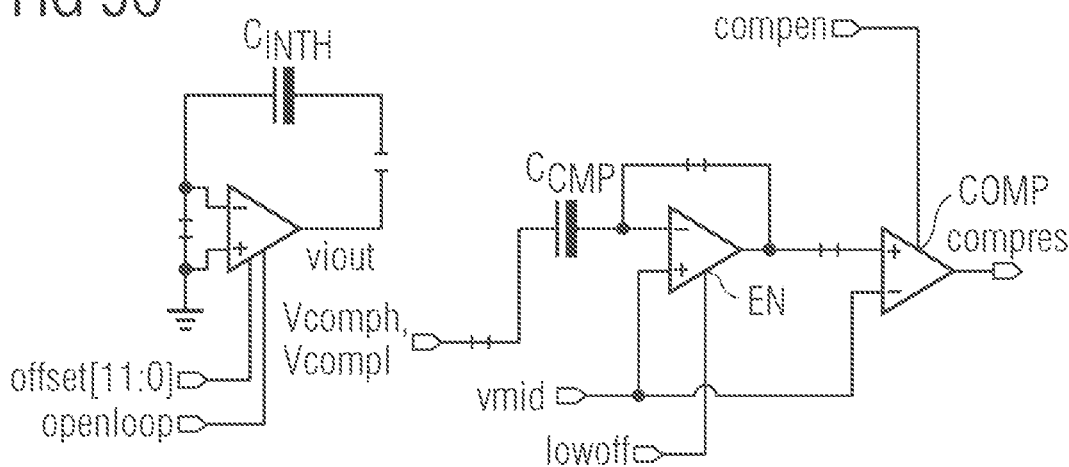

An overview of the open loop measure configuration is shown in FIG. 5C.

Open Loop Amplify Configuration

The open loop amplify state begins the process of comparing the integrator output, viout, to the comparator voltage, vcomp, by putting the comparator amplifier into its amplification mode. This is an open loop mode in which the comparator amplifier will swing above vmid if viout<vcomp and swing below vmid if viout>vcomp. The following switches are closed: hignsw, gsmpsw, shuntsw, compsw, lowoff, dlosw, dumpsw, shortsw, gndsw, openloop, and en. All other switches are open.

The open loop amplify configuration always follows the open loop measure configuration. The main amplifier basically continues in the open loop measure configuration. The comparator input capacitor is switched from vcomp to the integrator output. Since this capacitor has previously stored a value that will produce vmid at the comparator output, the comparator amplifier will begin to swing high or low if viout is below or above vcomp, respectively. The vcomp voltage will have been set to either Vcompl or Vcomph depending on the step in the auto-zero algorithm. The amplifier must swing enough in one clock period (1.36 µs) such that the latching comparator can resolve the correct answer. Thus there is some tradeoff between the offset and accuracy of the latching comparator and the speed and gain of the comparator amplifier.

Figure 5D:
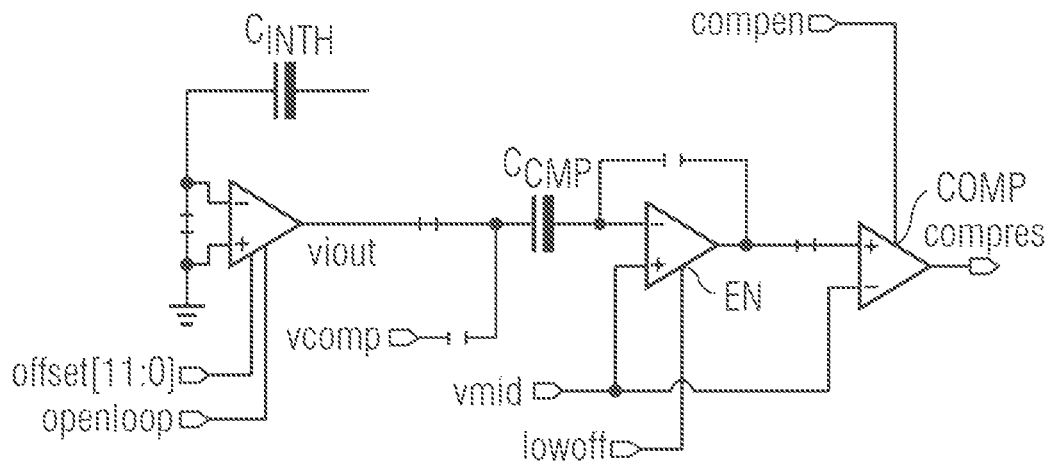

An overview of the open loop amplify configuration is shown in FIG. 5D.

Open Loop Compare Configuration

The open loop compare state completes the comparison of the integrator output, viout, to the comparator voltage, vcomp, by enabling the comparator latch. The following switches are closed: hignsw, gsmpsw, shuntsw, compsw, lowoff, dlosw, dumpsw, shortsw, gndsw, openloop, compare, and en. The open loop compare configuration always follows the open loop amplify configuration.

Figure 5E:
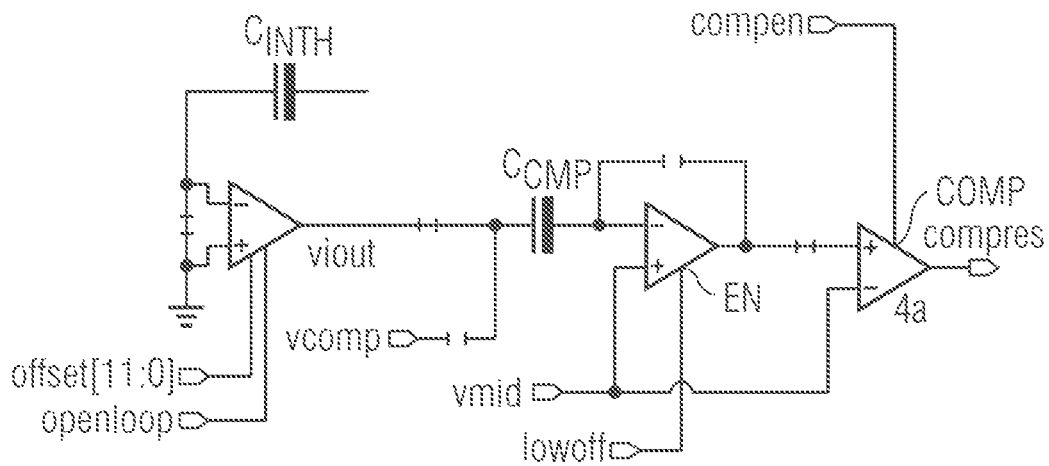

An overview of the open loop compare configuration is shown in FIG. 5E.

Offset Correction State Machine

Figure 6:
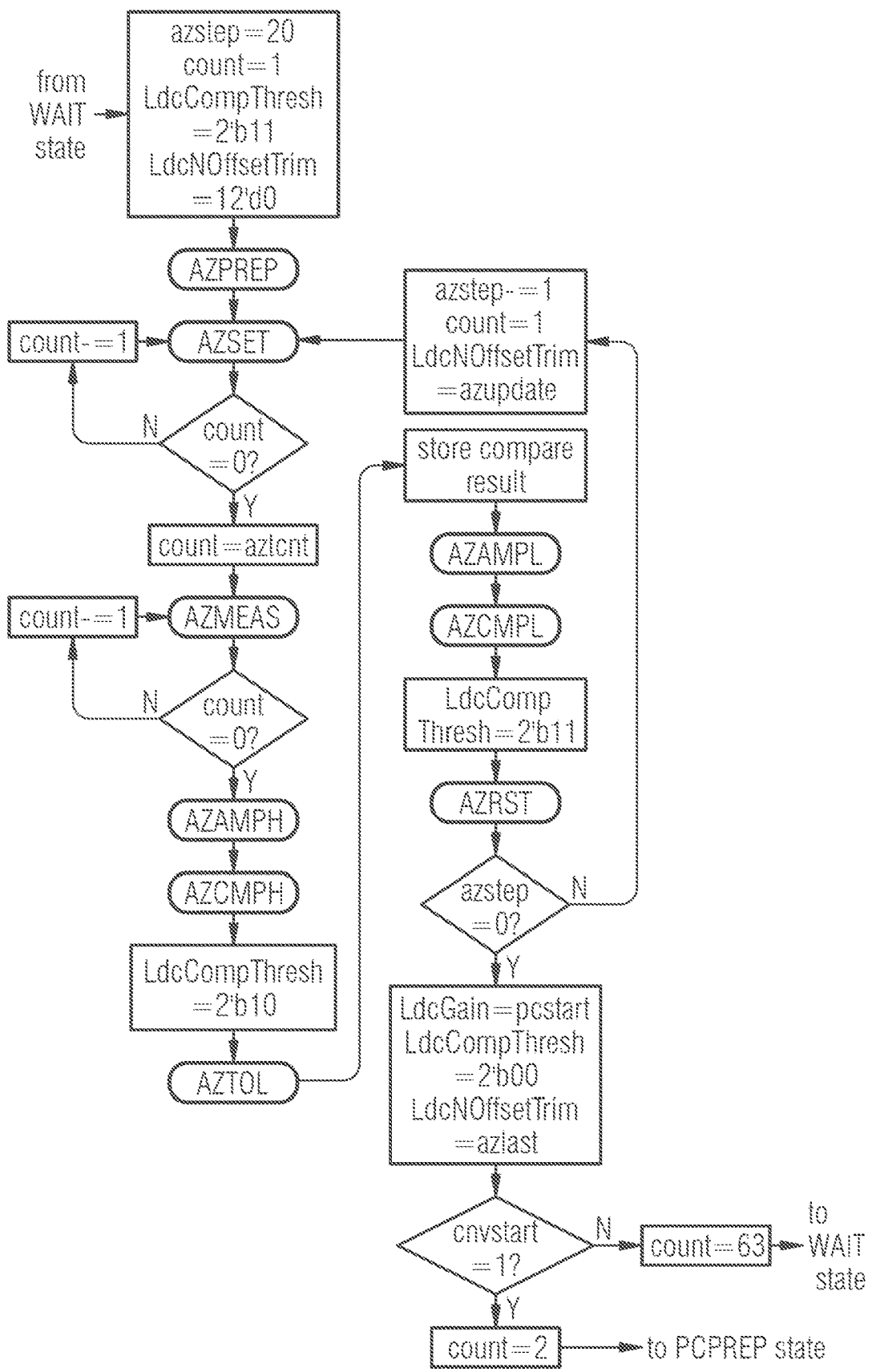
FIG. 6 shows a state machine diagram to sequence the configurations from FIGS. 5A through 5E.

The offset correction, or auto-zero, state machine, sequences the analog configurations described above. The auto-zero algorithm measures the DC offset of the main integrating amplifier and adjusts LdcNOffsetTrim until the measured DC offset is near zero. The state diagram for the auto-zero algorithm is shown in FIG. 6. It is to be noted that the WAIT state and PCPREP state listed in the diagram refer to states outside the auto-zero algorithm.

The auto-zero algorithm is initiated by setting cnvaz=1 when the LDC controller is in the WAIT state. Two counters are maintained: an auto-zero step counter, azstep, and a clock-cycle counter, count. The step counter is initially set to 20, and the cycle counter is set to 1. The LdcCompThresh parameter is set to 2'b11, which sets the vcomp output of the DAC is set to Vcomph. The LdcNOffsetTrim parameter is set to 0, which sets the AZDAC output to 0. The controller enters the AZPREP state, in which the analog circuit is placed in the high gain initialization configuration, where the vmid voltage is sampled on to the integration capacitor $C_{INTH}$.

On the next clock, the controller goes to the AZSET state, where it stays for two clocks. In the AZSET state, the circuit is placed in the high gain idle configuration, where the vmid voltage that was sampled on the integration capacitor is used to bias the main amplifier such that its output is vmid. It will actually be vmid plus whatever input offset exists in the main amplifier.

After the AZSET state, the counter "count" is set to aztcnt, and the controller goes to the AZMEAS state. The aztcnt is a count value that depends on the azstep counter. Those values are listed in a table later in this section. In the AZMEAS state, the circuit is placed in the open loop measure configuration, where the integrator input is shorted to ground and the amplifier is put in an open loop configuration. Any offset in the input will be amplified at the integrator output and cause the integrator output to deviate from the vmid starting point. The AZMEAS state lasts for aztcnt+1 clock cycles; the adaptive count is used to give longer times as the offset is corrected closer to zero. After the AZMEAS time is completed, the algorithm enters a sequence of 5 measure states, one clock each, beginning with the AZAMPH state.

In the AZAMPH state, the circuit is placed in the open loop amplify configuration, in which the integrator output is applied to the comparator input capacitor. It is to be noted that the comparator input capacitor had previously been initialized with Vcomph during the AZSET and AZMEAS states. That state is followed by the AZCMPH state, where the circuit is placed in the open loop compare configuration and the comparator makes a decision. The comparison result is stored in a register. The LDC controller then goes to the AZTOL state. The circuit is placed in the open loop measure configuration, vcomp switches to Vcompl, and that voltage is sampled on to the comparator input capacitor.

Next is the AZAMPL state, where the circuit is again placed in the open loop amplify configuration and the integrator output is applied to the comparator input capacitor. This is followed by the AZCMPL state, where the circuit is placed in the open loop compare configuration and the comparator makes a decision. The auto-zero algorithm step is completed by going to the AZRST state, where the circuit is placed in the high gain initialization configuration, and vmid is once again sampled on to the integration capacitor in preparation for the next loop in the algorithm. By using this reset state prior to beginning the next loop in the algorithm, the amplifier does not need to recover from the swing in the previous pass of the loop. After the AZRST state, the LdcNOffsetTrim value is updated to azupdate. Each azstep is associated with a gradually decreasing azchange value. These value are listed in Table 2 below. For all but the last step, if the measured integrator output was greater than Vcomph, that is, the comparison from the AZCMPH state was high, then azupdate is the current LdcNOffsetTrim value minus azchange. If the measured integrator output was less than Vcompl, that is, the comparison from the AZCMPL state was low, then azupdate is the current LdcNOffsetTrim value plus azchange. If the measured integrator output was in the middle, that is, neither of the previous two conditions are true, then the azupdate is simply the current value of LdcNOffsetTrim.

For the last step in the auto-zero algorithm, the update algorithm is changed to bias the offset to be slightly negative. Here, if the integrator output was not less than Vcompl, that is, the comparison from the AZCMPL state was high, then azupdate is the current LdcNOffsetTrim value minus azchange. Otherwise, if the integrator output was less than Vcompl, then the azupdate is simply the current value of LdcNOffsetTrim.

The auto-zero state machine is driven by a fixed-frequency oscillator. The number of clocks for each state determines the total time for each state. The number of clocks for each loop in the auto-zero algorithm is aztcnt+9, except for the first pass which has the extra AZPREP state. The number of clocks for the first loop is aztcnt+10. Table 2 below lists the number of clocks for each loop in the auto-zero algorithm, as well as the artcnt and azchange values for each step.

The number of clocks for each step is increased as the azchange value decreases. The number of clocks for each step is designed such that, for the voltage change represented by azchange, the times in Table 1 are satisfied.

TABLE 2

| azstep | azchange | aztcnt | Loop Clocks |
|---|---|---|---|
| 20 | 1024 | 1 | 11 |
| 19 | 512 | 1 | 10 |
| 18 | 512 | 1 | 10 |
| 17 | 256 | 1 | 10 |
| 16 | 256 | 1 | 10 |
| 15 | 128 | 1 | 10 |
| 14 | 128 | 1 | 10 |
| 13 | 64 | 1 | 10 |
| 12 | 64 | 1 | 10 |
| 11 | 32 | 2 | 11 |
| 10 | 32 | 2 | 11 |
| 9 | 16 | 4 | 13 |
| 8 | 16 | 4 | 13 |
| 7 | 8 | 8 | 17 |
| 6 | 8 | 8 | 17 |
| 5 | 4 | 16 | 25 |
| 4 | 4 | 16 | 25 |
| 3 | 2 | 32 | 41 |
| 2 | 2 | 32 | 41 |
| 1 | 1 | 64 | 73 |
| 0 | 1 | 64 | 73 |

It is to be noted in Table 2 that, except for the first step, the algorithm spends two loops at each azchange value. This provides redundancy in the search algorithm which in turn provides noise immunity. If an incorrect decision is made due to noise, the subsequent algorithm steps can correct the error.

Adding up all of the clock periods for each loop, the total number of clocks for the auto-zero algorithm is 451. For the nominal clock period of 1.356 μs, this is a total time of about 612 μs.

Once the auto-zero algorithm is completed, the vcomp DAC output is set back to vmid and the value of the cnvstart flag is checked. If it is 1, a diode measurement begins by branching to the PCPREP state. If not, the counter is set to the "warm" start value of 63, and the controller jumps back to the WAIT state.

Averaging Algorithm

The offset state machine can be augmented to include averaging in the following way. The azstep table has additional fractional values added as shown in Table 3 below. For example, for ¼ step averaging, the main autozero algorithm continues until azstep=−4. Then, the autozero algorithm continues to loop with azstep fixed at −4. The number of loops with the azstep fixed is the number of averaging steps. For example, with an azchange value of ¼, it takes four consecutive comparator decisions above Vcomph to cause a one-LSB change in the LdcNOffsetTrim value. This averaging is useful for compensating for noise in the comparator result that is not corrected by the two-level comparator.

TABLE 3

| azstep | azchange | aztcnt | Loop Clocks |
|---|---|---|---|
| −1 | ½ | 64 | 73 |
| −2 | ½ | 64 | 73 |
| −3 | ¼ | 64 | 73 |
| −4 | ¼ | 64 | 73 |

½ Bit Per Step Algorithm

The offset state machine can be altered from a two-bit per step algorithm to a ½ bit per step algorithm simply by altering the azstep table as shown in Table 4. Like the two-bit per step algorithm, the ½-bit per step algorithm also provides redundancy to correct for comparison errors.

TABLE 4

| azstep | azchange | aztcnt | Loop Clocks |
|---|---|---|---|
| 20 | 1024 | 1 | 11 |
| 19 | 768 | 1 | 10 |
| 18 | 512 | 1 | 10 |
| 17 | 384 | 1 | 10 |
| 16 | 256 | 1 | 10 |
| 15 | 192 | 1 | 10 |
| 14 | 128 | 1 | 10 |
| 13 | 96 | 1 | 10 |
| 12 | 64 | 1 | 10 |
| 11 | 48 | 2 | 11 |
| 10 | 32 | 2 | 11 |
| 9 | 24 | 4 | 13 |
| 8 | 16 | 4 | 13 |
| 7 | 12 | 8 | 17 |
| 6 | 8 | 8 | 17 |
| 5 | 6 | 16 | 25 |
| 4 | 4 | 16 | 25 |
| 3 | 3 | 32 | 41 |
| 2 | 2 | 32 | 41 |
| 1 | 1.5 | 64 | 73 |
| 0 | 1 | 64 | 73 |
| −1 | ¾ | 64 | 73 |
| −2 | ½ | 64 | 73 |
| −3 | ⅜ | 64 | 73 |
| −4 | ¼ | 64 | 73 |

Switch Control Signals

The switch control signals for the states in auto-zero computation group are summarized in Table 5 below.

TABLE 5

| State | cnvdone | LdcFunction | LdcCapGain | LdcCapSample | LdcDiodeEn | LdcInitZ | LdcAccumulate | LdcCompAmplify |
|---|---|---|---|---|---|---|---|---|
| AZPREP | 0 | 1 | 1 | 1 | 0 | 0 | 0 | 0 |
| AZSET | 0 | 1 | 1 | 1 | 0 | 1 | 1 | 0 |
| AZMEAS | 0 | 1 | 1 | 1 | 0 | 1 | 0 | 0 |
| AZAMPH | 0 | 1 | 1 | 1 | 0 | 1 | 0 | 1 |
| AZCMPH | 0 | 1 | 1 | 1 | 0 | 1 | 0 | 1 |

TABLE 5-continued

| | | | | | | | | |
|---|---|---|---|---|---|---|---|---|
| AZTOL | 0 | 1 | 1 | 1 | 0 | 1 | 0 | 0 |
| AZAMPL | 0 | 1 | 1 | 1 | 0 | 1 | 0 | 1 |
| AZCMPL | 0 | 1 | 1 | 1 | 0 | 1 | 0 | 1 |
| AZRST | 0 | 1 | 1 | 1 | 0 | 0 | 0 | 0 |

| State | LdcCompPoll | LdcDownCharge | LdcUpCharge | LdcForceCharge | LdcLift | LdcCompHighRes |
|---|---|---|---|---|---|---|
| AZPREP | 0 | 0 | 0 | 0 | 0 | 1 |
| AZSET | 0 | 0 | 0 | 0 | 0 | 1 |
| AZMEAS | 0 | 0 | 0 | 0 | 0 | 1 |
| AZAMPH | 0 | 0 | 0 | 0 | 0 | 1 |
| AZCMPH | 1 | 0 | 0 | 0 | 0 | 1 |
| AZTOL | 0 | 0 | 0 | 0 | 0 | 1 |
| AZAMPL | 0 | 0 | 0 | 0 | 0 | 1 |
| AZCMPL | 1 | 0 | 0 | 0 | 0 | 1 |
| AZRST | 0 | 0 | 0 | 0 | 0 | 1 |

Figure 7A:
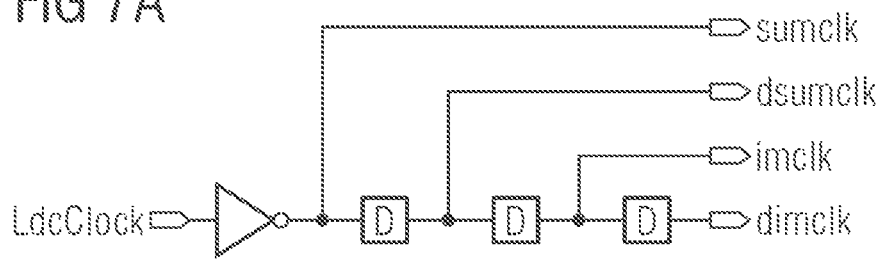
FIGS. 7A through 7I show circuits to generate switch control signals to operate the core analog circuit of FIG. 3.

The switch control signals listed in the table above are converted into phased, non-overlapping switch enables using the circuits shown in FIGS. 7A to 7I. The LDC operates on the falling edge of the main controller clock. The switch controls must be configured such that unintentional charge sharing does not occur. In addition, there are nodes that are very sensitive, and need to be switched at a different time than the rest of the nodes. Therefore, two pairs of a clock and a delayed clock are generated. Switches that are changing are opened on one of the pair's non-delayed clock and closed on that pair's delayed clock. The delay amount is nominally 5 ns. The variation over PVT must be such that, for a given clock pair, all switches that are opening must completely open before any new switches close. Conceptually, the clock pair generation circuit is shown in FIG. 7A.

Both of the clock pairs start with the inverse of the main controller clock. This is both to give a half clock period of timing slop between the logic embedded in the analog circuits and the synthesized digital logic, and to have the switching occur on the less noisy edge of the clock. The sensitive node signals use the sumclk/dsumclk pair. The other nodes use the imclk/dimclk pair. Other signals are in the original LdcClock domain.

Figure 7B:
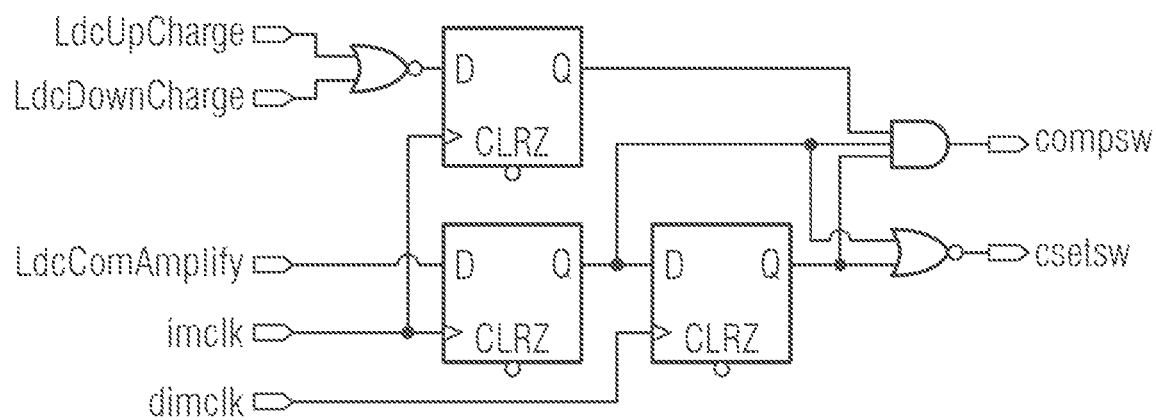

The comparator input control switches, csetsw and compsw, are mainly controlled by LdcCompAmplify, but compsw is also disabled when LdcDownCharge or LdcUpCharge are high as shown in FIG. 7B.

Figure 7C:
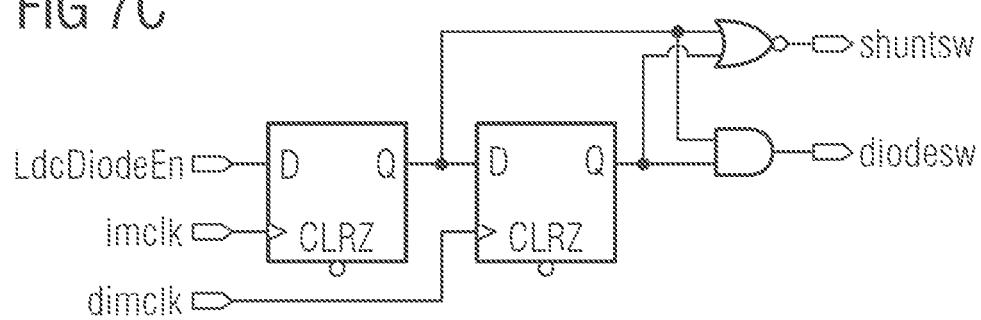
Figure 7D:
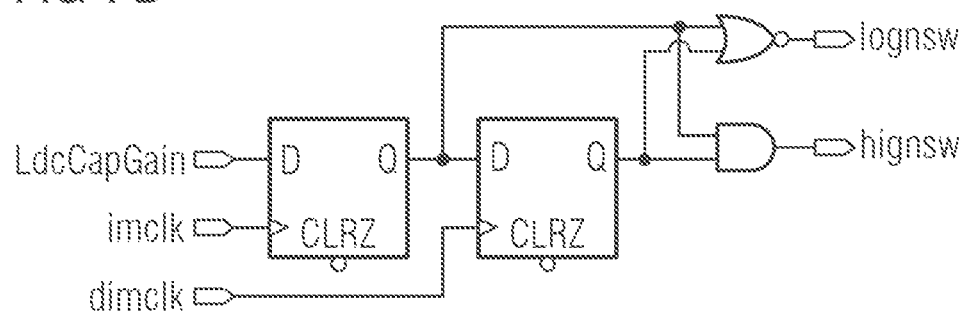
Figure 7E:
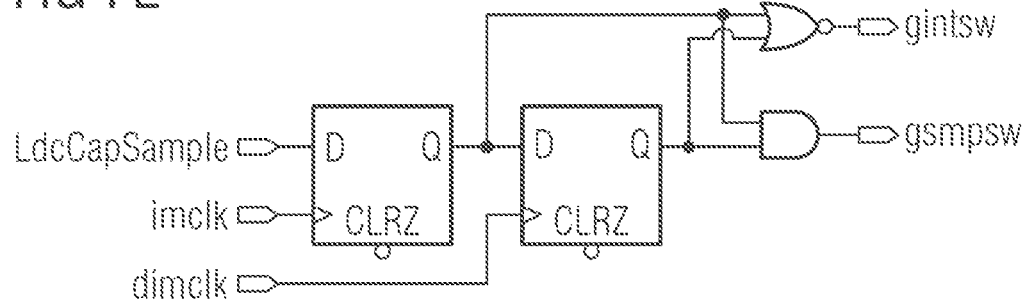

The diode and integrator gain switches are all simple non-overlapping pairs generated from LDC controller signals, as shown in FIG. 7C, FIG. 7D and FIG. 7E.

Figure 7F:
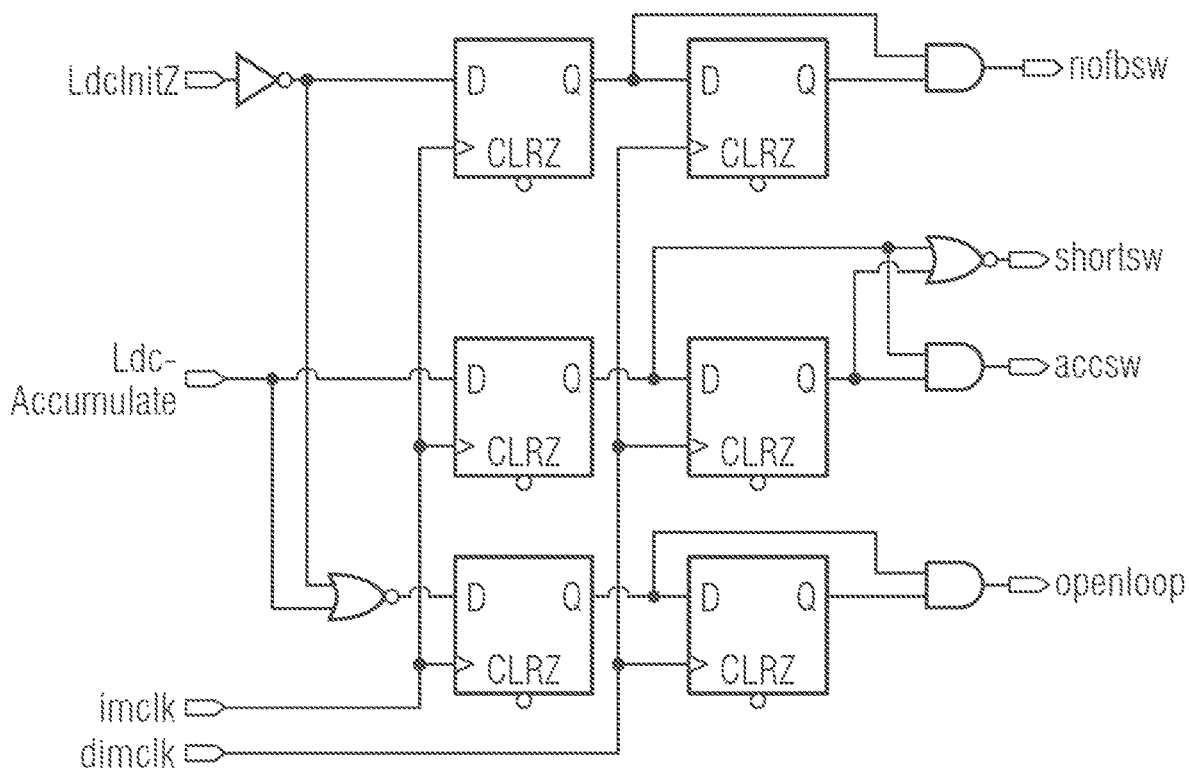

The nofbsw switch is enabled if LdcInitZ is low. The accsw and shortsw signals are non-inverted and inverted non-overlapping versions of LdcAccumulate. The openloop signal is true when LdcAccumulate is low and LdcInitZ is high. The combined logic is illustrated in FIG. 7F.

Figure 7G:
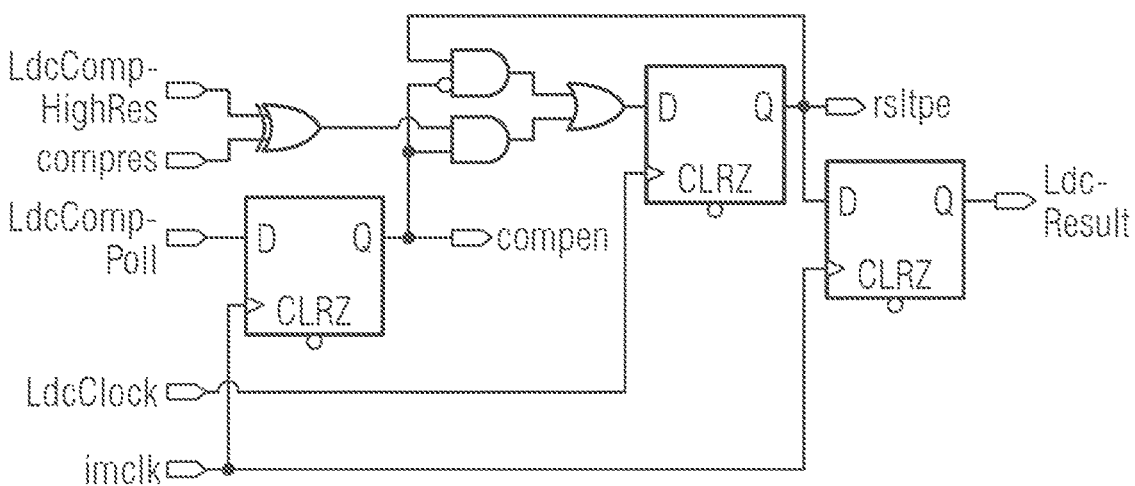

The latching comparator is enabled on the falling edge of the main clock when LdcCompPoll is high, and the result is captured and held on the rising edge. This capture result is recaptured on the falling edge of the main clock before being fed back to the LDC controller to enable relaxed timing requirements. The comparator result is inverted if the high resolution comparator amplifier is enabled, in order to account for the inversion due to that amplifier. The circuit concept for this is shown in FIG. 7G.

Figure 7H:
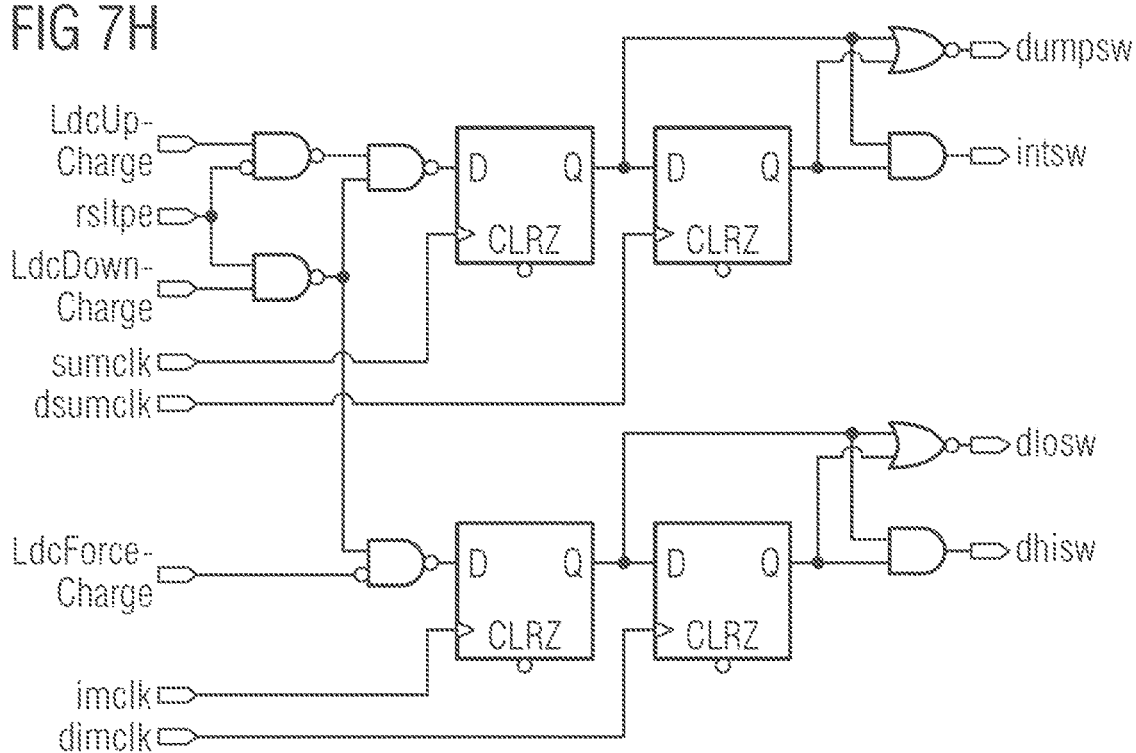

The comparator result is combined with control signals from the LDC controller to generate the switch signals for the charge redistribution capacitor, using the circuit depicted in FIG. 7H. It is to be noted that the intsw and dumpsw signals are timed with the sensitive node clock pair.

Figure 7I:
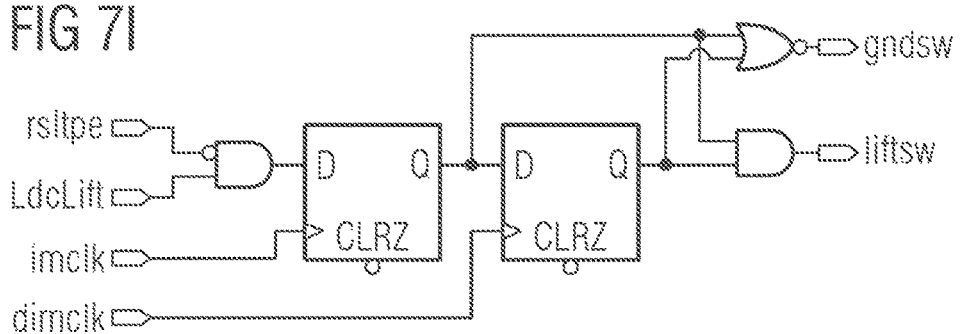

The lift switch control is enabled if LdcLift is high and the comparator result was low, using the circuit in FIG. 7I.

The switch enable signals are applied to the core analog circuit described above in connection with FIG. 4 and the circuit configurations of FIGS. 5A through 5E.

The method and the arrangement according to the present disclosure employ one or more of the following:
Use of two comparison thresholds (Vcomph and Vcompl) to create noise immunity.
Use of a reset procedure at each decision step to speed recovery time between steps.
Use of varied sampling times with short times in the beginning and longer times at the end to shorten the total time for the algorithm while not sacrificing accuracy.
Use of a two-step per bit algorithm to provide error recovery in case of a wrong decision.

Figure 8:
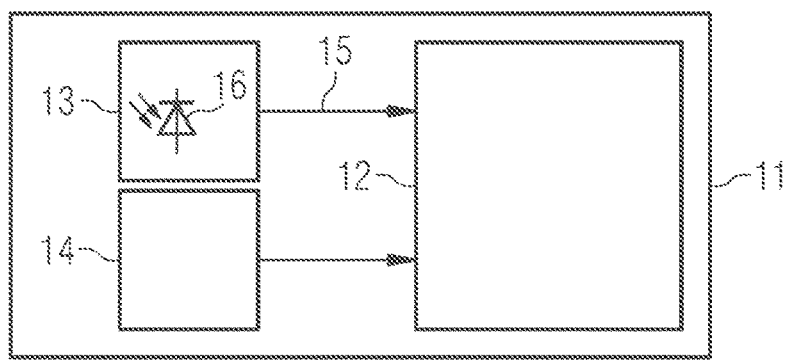
FIG. 8 shows a mobile computing device including the circuit of FIG. 3.

FIG. 8 depicts a technical application of the optical sensor arrangement of the present disclosure. FIG. 8 shows a mobile computing device 11 such as a tablet computer or a smartphone. Device 11 includes a display screen 12 which displays information generated by a processor 14. The light sensor 13 controls the brightness of the display 12 in response to the ambient light sensing function 16 of the device 13 to achieve a convenient appearance of the display to the user. The light sensor 13 comprises an output terminal 15 that provides a signal indicative of the ambient light to control the brightness of the display. The light sensor 13 is realized according to the principles described hereinabove and operates according to the methods described hereinabove. The improved accuracy of the light sensor 13 allows a more accurate and faster brightness control so that use of the device is more convenient.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirit and substance of the disclosure may occur to the persons skilled in the art, the disclosure should be construed to include everything within the scope of the appended claims.

The invention claimed is:
1. A method to operate an optical sensor arrangement, the optical sensor arrangement comprising:
a photodiode;
a converter arrangement, comprising:
an integration amplifier and a comparator amplifier, the integration amplifier having an offset;

an integration capacitor coupled to an input of the integration amplifier;
a comparator capacitor coupled to an input of the comparator amplifier;
an offset register to control the offset of the integration amplifier in response to an offset trim value stored in the offset register;
the photodiode decoupled from the input side of the first amplifier;
a controller to operate the converter arrangement;
the method comprising performing a multitude of offset reduction loops, wherein the integration capacitor is connected to the integration amplifier to form an integrator or is connected to the output of the comparator amplifier or is open ended,
each loop comprising the steps of:
shorting the inputs of the integration amplifier to ground potential;
sampling a reference voltage on the integration capacitor;
applying one of a high and a low comparison voltage to the comparator capacitor;
comparing an integrator output signal with the one of the comparison voltages at the comparator amplifier;
applying another one of the high and the low comparison voltages to the comparator capacitor;
comparing the integrator output signal with the other one of the comparison voltages at the comparator amplifier; and
adjusting the offset trim value in response to one of the steps of comparing.

2. The method according to claim 1, wherein a reference voltage is applied to an output of the integration amplifier after the comparing the integrator output signal with the other one of the comparison voltages at the comparator amplifier in each one of the multitude of offset reduction loops to perform a reset of the integration amplifier.

3. The method according to claim 2, wherein the comparator amplifier is set to sample the reference voltage and the output of the comparator amplifier drives the output of the integration amplifier at the end of an offset reduction loop to perform a reset of the integration amplifier.

4. The method according to claim 2, wherein the comparator amplifier drives the output of the integration amplifier after adjusting the offset trim value to perform a reset of the integration amplifier.

5. The method according to claim 1, further comprising: counting the time to perform an offset reduction loop and increasing the time for performing in a subsequent offset reduction loop.

6. The method according to claim 5, wherein adjusting the offset trim value comprises adjusting the offset trim value by a change value, wherein the change value is decreased in a subsequent offset reduction loop.

7. The method according to claim 6, further comprising performing at least two offset reduction loops consecutively while maintaining the change value.

8. The method according to claim 1, further comprising: counting the time perform an offset reduction loop and adjusting the offset trim value by a change value and, in a subsequent offset reduction loop, increasing the time for performing and reducing the change value.

9. The method according to claim 1, further comprising, in subsequent ones of the multitude of offset reduction loops, gradually decreasing a change value to update the offset trim value and performing an adaptive count to give longer time for the performance of a loop as the offset is corrected closer to zero.

10. The method according to claim 1, wherein the photodiode is coupled through a switch to an input side of the integration amplifier and, during performing the multitude of offset reduction loops, the photodiode is decoupled from the input side of the integration amplifier.

11. An optical sensor arrangement, comprising:
a photodiode;
a converter arrangement, comprising:
an integration amplifier and a comparator amplifier, the integration amplifier having an offset;
an integration capacitor coupled to an input of the integration amplifier;
a comparator capacitor coupled to an input of the comparator amplifier;
an offset register to control the offset of the integration amplifier in response to an offset trim value stored in the offset register;
the photodiode to be coupled to the input side of the first amplifier;
a controller to generate control signals operate the converter arrangement through a multitude of offset correction loops,
wherein the converter arrangement is configured to adopt a configuration in response to the control signals generated by the controller, the configuration selected from the group comprising a high gain initialization configuration, a high gain idle configuration, an open loop measure configuration, an open loop amplify configuration and an open loop compare configuration,
wherein the converter arrangement is configured to perform a consecutive sequence of two or more of said configurations to achieve an offset reduction of the integration amplifier.

12. The optical sensor arrangement according to claim 11, wherein, in the high gain initialization configuration, the integration amplifier is configured in a no-feedback state, an output of the integration amplifier is disconnected from the comparator capacitor, inputs of the integration amplifier are shorted through a switch and the integration capacitor is connected to the output of the comparator amplifier to sample a reference voltage on the integration capacitor.

13. The optical sensor arrangement according to claim 11, wherein, in the high gain idle configuration, the integration amplifier is configured in a feedback state, the output of the integration amplifier is disconnected from the output of the comparator amplifier and the switch across the inputs of the integration capacitor is opened.

14. The optical sensor arrangement according to claim 11, wherein, in the open loop measure configuration, the feedback around the integration amplifier is removed, the inputs of the integration amplifier are shorted to ground potential and one of a high and a low comparison voltage is applied to the comparator capacitor.

15. The optical sensor arrangement according to claim 11, wherein, in the open loop amplify configuration, the feedback around the integration amplifier is open, the inputs of the integration amplifier are shorted to ground potential and the output of the integration amplifier is connected to the comparator capacitor.

16. The optical sensor arrangement according to claim 11, wherein, in the open loop compare configuration, the feedback around the integration amplifier is open, the inputs of the integration amplifier are shorted to ground potential and the output of the integration amplifier is connected to the comparator capacitor, wherein one of the comparator amplifier and a comparator device that is connected to the output of the comparator amplifier are configured to make a decision.

17. The optical sensor arrangement according to claim 11, wherein the photodiode is coupled through a switch to an input side of the integration amplifier and the photodiode is decoupled from the input side of the integration amplifier, wherein the integration capacitor is connected to the integration amplifier to form an integrator or is connected to the output of the comparator amplifier or is open ended,
wherein, in the high gain initialization configuration, the integration amplifier is configured in a no-feedback state, an output of the integration amplifier is disconnected from the comparator capacitor, inputs of the integration amplifier are shorted through a switch and the integration capacitor is connected to the output of the comparator amplifier to sample a reference voltage on the integration capacitor,
wherein, in the high gain idle configuration, the integration amplifier is configured in a feedback state, the output of the integration amplifier is disconnected from the output of the comparator amplifier and the switch across the inputs of the integration capacitor is opened,
wherein, in the open loop measure configuration, the feedback around the integration amplifier is removed, the inputs of the integration amplifier are shorted to ground potential and one of a high and a low comparison voltage is applied to the comparator capacitor,
wherein, in the open loop amplify configuration, the feedback around the integration amplifier is open, the inputs of the integration amplifier are shorted to ground potential and the output of the integration amplifier is connected to the comparator capacitor, and
wherein, in the open loop compare configuration, the feedback around the integration amplifier is open, the inputs of the integration amplifier are shorted to ground potential and the output of the integration amplifier is connected to the comparator capacitor, wherein one of the comparator amplifier and a comparator device that is connected to the output of the comparator amplifier are configured to make a decision.

18. A mobile computing device comprising an optical sensor arrangement and a display screen, the optical sensor arrangement comprising:
  a photodiode;
  a converter arrangement, comprising:
    an integration amplifier and a comparator amplifier, the integration amplifier having an offset;
    an integration capacitor coupled to an input of the integration amplifier;
    a comparator capacitor coupled to an input of the comparator amplifier;
    an offset register to control the offset of the integration amplifier in response to an offset trim value stored in the offset register;
    the photodiode to be coupled to the input side of the first amplifier;
  a controller to generate control signals operate the converter arrangement through a multitude of offset correction loops,
    wherein the converter arrangement is configured to adopt a configuration in response to the control signals generated by the controller, the configuration selected from the group comprising a high gain initialization configuration, a high gain idle configuration, an open loop measure configuration, an open loop amplify configuration and an open loop compare configuration,
    wherein the converter arrangement is configured to perform a consecutive sequence of two or more of said configurations to achieve an offset reduction of the integration amplifier,
    wherein the optical sensor arrangement comprises an output terminal to supply a signal indicative of ambient light and wherein the brightness of the display screen is controlled in dependence on the signal indicative of ambient light generated by the light sensor arrangement.

* * * * *

UNITED STATES PATENT AND TRADEMARK OFFICE
CERTIFICATE OF CORRECTION

PATENT NO. : 11,143,553 B2  
APPLICATION NO. : 16/955658  
DATED : October 12, 2021  
INVENTOR(S) : Louis Albert Williams Page 1 of 1

It is certified that error appears in the above-identified patent and that said Letters Patent is hereby corrected as shown below:

On the Title Page

Left Column, Item (22), please correct the PCT filing date to be:
December 18, 2018

Signed and Sealed this
Fourth Day of January, 2022

Drew Hirshfeld
*Performing the Functions and Duties of the
Under Secretary of Commerce for Intellectual Property and
Director of the United States Patent and Trademark Office*